(12) United States Patent
Ohhashi et al.

(10) Patent No.: US 11,898,081 B2
(45) Date of Patent: Feb. 13, 2024

(54) RUTHENIUM-ETCHING SOLUTION, METHOD FOR MANUFACTURING RUTHENIUM-ETCHING SOLUTION, METHOD FOR PROCESSING OBJECT TO BE PROCESSED, AND METHOD FOR MANUFACTURING RUTHENIUM-CONTAINING WIRING

(71) Applicant: TOKYO OHKA KOGYO CO., LTD., Kawasaki (JP)

(72) Inventors: Takuya Ohhashi, Kawasaki (JP); Yukihisa Wada, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 0 days.

(21) Appl. No.: 17/095,159

(22) Filed: Nov. 11, 2020

(65) Prior Publication Data

US 2021/0155851 A1 May 27, 2021

(30) Foreign Application Priority Data

Nov. 21, 2019 (JP) .................................. 2019-210515
Oct. 8, 2020 (JP) .................................. 2020-170554

(51) Int. Cl.
*C09K 13/04* (2006.01)
*H01L 21/48* (2006.01)
(Continued)

(52) U.S. Cl.
CPC .............. *C09K 13/04* (2013.01); *C09K 13/00* (2013.01); *C23F 1/00* (2013.01); *C23F 1/14* (2013.01);
(Continued)

(58) Field of Classification Search
None
See application file for complete search history.

(56) References Cited

U.S. PATENT DOCUMENTS 7,354,861 B1    4/2008   Nakamura et al.
8,211,800 B2 *   7/2012   Uozumi ............ H01L 21/76814
                                                                    438/653

(Continued)

FOREIGN PATENT DOCUMENTS

JP    2000-167764 A    6/2000
JP    2002-016053 A    1/2002

(Continued)

OTHER PUBLICATIONS

D. Jensen, "National Technology Roadmap for Semiconductors", in "Contamination-Free Manufacturing for Semiconductor and Other Products", edited by R.P. Donovan, CRC Press, Boca Raton, pp. 7-21. (Year: 2001).*

(Continued)

*Primary Examiner* — Jiong-Ping Lu
(74) *Attorney, Agent, or Firm* — Knobbe, Martens, Olson & Bear, LLP

(57) ABSTRACT

A ruthenium-etching solution for carrying out an etching process on ruthenium. The etching solution includes ortho-periodic acid and ammonia, in which a pH is 8 or higher and 10 or lower. A method for manufacturing the ruthenium-etching solution, a method for processing an object to be processed including carrying out an etching process on an object to be processed including ruthenium using the ruthenium-etching solution, and a method for manufacturing a ruthenium-containing wiring.

6 Claims, 1 Drawing Sheet

(51) Int. Cl.
  *C09K 13/00* (2006.01)
  *H01L 21/3213* (2006.01)
  *C23F 1/14* (2006.01)
  *C23F 1/40* (2006.01)
  *C23F 1/00* (2006.01)
  *H01L 21/306* (2006.01)

(52) U.S. Cl.
  CPC .......... *C23F 1/40* (2013.01); *H01L 21/30604* (2013.01); *H01L 21/32134* (2013.01); *H01L 21/4892* (2013.01)

(56) References Cited

U.S. PATENT DOCUMENTS

| | | | |
|---|---|---|---|
| 2003/0159362 A1 | 8/2003 | Singh et al. | |
| 2004/0115908 A1* | 6/2004 | Marsh | H01L 29/66462 257/E21.309 |
| 2006/0134915 A1 | 6/2006 | Hoang et al. | |
| 2006/0278606 A1 | 12/2006 | Park et al. | |
| 2012/0256122 A1 | 10/2012 | Sato et al. | |
| 2019/0300750 A1* | 10/2019 | Lin | C09G 1/02 |
| 2020/0347299 A1* | 11/2020 | Takahashi | C09K 13/06 |

FOREIGN PATENT DOCUMENTS

| | | | | |
|---|---|---|---|---|
| JP | 2005-518669 A | | 6/2005 | |
| JP | 2006-517737 A | | 7/2006 | |
| JP | 2006-344939 A | | 12/2006 | |
| JP | 2016-092101 A | | 5/2016 | |
| JP | 2020087945 | * | 6/2020 | .............. C11D 7/08 |
| WO | WO 2011/074601 A1 | | 6/2011 | |
| WO | WO 2016/068183 A1 | | 5/2016 | |
| WO | WO 2019/138814 A1 | | 7/2019 | |

OTHER PUBLICATIONS

Office Action issued in Japanese Patent Application No. 2019-210515, dated Apr. 7, 2020.

Office Action issued in Japanese Patent Application No. 2019-210515, dated Jun. 16, 2020.

Decision to Decline an Amendment issued in Japanese Patent Application No. 2019-210515, dated Aug. 25, 2020.

Office Action in Japanese Patent Application No. 2020-170554, dated Feb. 16, 2021.

* cited by examiner

RUTHENIUM-ETCHING SOLUTION, METHOD FOR MANUFACTURING RUTHENIUM-ETCHING SOLUTION, METHOD FOR PROCESSING OBJECT TO BE PROCESSED, AND METHOD FOR MANUFACTURING RUTHENIUM-CONTAINING WIRING

BACKGROUND OF THE INVENTION

Field of the Invention

The present invention relates to a ruthenium-etching solution, a method for manufacturing a ruthenium-etching solution, a method for processing an object to be processed, and a method for manufacturing a ruthenium-containing wiring.

Priority is claimed on Japanese Patent Application No. 2019-210515 filed in Japan on Nov. 21, 2019, and Japanese Patent Application No. 2020-170554 filed in Japan on Oct. 8, 2020, the contents of which are incorporated herein by reference.

Description of Related Art

A semiconductor device-manufacturing process involves various processing steps with multiple stages. Such processing steps also include a process of patterning a semiconductor layer, an electrode, or the like by etching or the like. In recent years, in tandem with the progress regarding higher integration, higher speed, and the like of semiconductor devices, ruthenium (Ru) has been used for wiring and the like. In such a case, the ruthenium is an object to be etched.

As a ruthenium etching solution for carrying out an etching process on ruthenium, for example, a solution including orthoperiodic acid as an oxidizing agent has been proposed (PCT International Publication No. WO2016/68183 and Japanese Unexamined Patent Application, First Publication No. 2016-92101).

In addition, PCT International Publication No. WO2019/138814 describes a ruthenium etching solution (Table 1, Example A32) including orthoperiodic acid and ammonia and having a pH of 4.5.

SUMMARY OF THE INVENTION

In an etching process in a semiconductor device-manufacturing process, if the etching rate is excessively small, the etching process takes a long time, which is not practical. In addition, in a case where an etching solution as described in PCT International Publication No. WO2019/138814 is used, there is a concern that toxic ruthenium tetroxide ($RuO_4$) may be produced by contact between the etching solution and ruthenium.

Therefore, there is a demand for a ruthenium-etching solution having an industrially practical etching rate with which the production of ruthenium tetroxide is suppressed.

The present invention was made in view of the above circumstances and has an object of providing a ruthenium-etching solution which is practical in a ruthenium etching process and which has a reduced risk of generating ruthenium tetroxide, a method for manufacturing the ruthenium-etching solution, and a method for processing an object to be processed using the etching solution, and a method for manufacturing a ruthenium containing wiring.

In order to solve the problems described above, the present invention adopts the following configurations.

A first aspect of the present invention is a ruthenium-etching solution for carrying out an etching process on ruthenium, including orthoperiodic acid and ammonia, in which a pH is 8 or higher and 10 or lower.

A second aspect of the present invention is a method for manufacturing the ruthenium-etching solution, the method including, in the following order, preparing a mixed solution by mixing a solution including orthoperiodic acid with aqueous ammonia, and adjusting a pH of the mixed solution to 8 or higher and 10 or lower, and filtering the mixed solution with a filter.

A third aspect of the present invention is a method for processing an object to be processed, the method including carrying out an etching process on an object to be processed including ruthenium, using the ruthenium-etching solution.

A fourth aspect of the present invention is a method for manufacturing a ruthenium-containing wiring, the method including applying the ruthenium-etching solution to a substrate including an area formed of an insulating film and an area formed of ruthenium in a surface layer, and thereby selectively etching the area formed of ruthenium.

According to the present invention, it is possible to provide a ruthenium-etching solution which is practical in a ruthenium etching process and which has a reduced risk of generating ruthenium tetroxide, a method for manufacturing the ruthenium-etching solution, and a method for processing an object to be processed using the ruthenium-etching solution, and a method for manufacturing a ruthenium-containing wiring.

Figure 1:
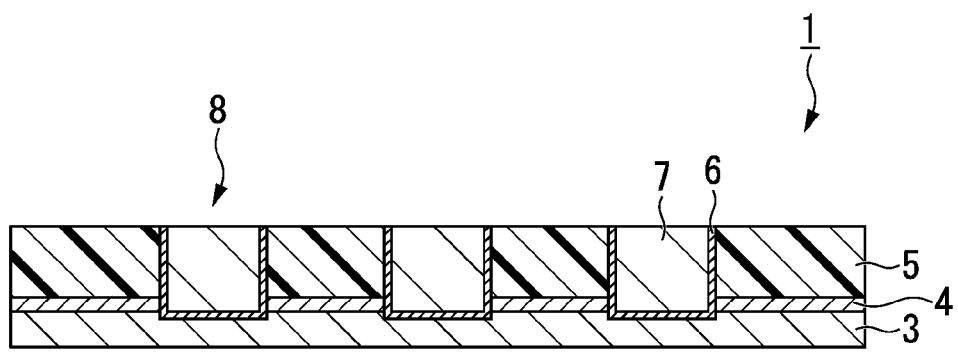
FIG. 1 is a schematic view showing an example of a substrate having a ruthenium-containing wiring, which is an object to be processed in a recess etching process.

DETAILED DESCRIPTION OF THE INVENTION (Ruthenium-Etching Solution)

The ruthenium-etching solution according to the first aspect of the present invention includes orthoperiodic acid and ammonia and has a pH of 8 or higher and 10 or lower. The ruthenium-etching solution according to the present aspect is used for carrying out an etching process on ruthenium. Hereinafter, "ruthenium-etching solution" may be simply referred to as "etching solution" in this specification.

<Orthoperiodic Acid>

The etching solution according to the present embodiment includes orthoperiodic acid ($H_5IO_6$).

The content of orthoperiodic acid in the etching solution of the present embodiment is not particularly limited, but examples thereof include 0.05 to 8% by mass with respect to the total mass of the etching solution, preferably 0.1 to 7% by mass, more preferably 0.5 to 5% by mass, and even more preferably 0.5 to 3% by mass. When the content of orthoperiodic acid is in the above range, the etching rate with respect to the ruthenium is further improved.

<Ammonia>

The etching solution according to the present embodiment includes ammonia ($NH_3$).

The content of ammonia in the etching solution of the present embodiment is not particularly limited as long as the content is such that the pH of the etching solution of the present embodiment is 8 or higher, according to the content of the orthoperiodic acid and the amount of other pH adjusters added as necessary. Preferably, ammonia is used at a content so as to have a preferable pH range for the etching solution of the present embodiment described below. Examples of such an ammonia content include 5 to 150 parts by mass with respect to 100 parts by mass of the blending amount of the orthoperiodic acid, preferably 10 to 100 parts by mass, and more preferably 15 to 75 parts by mass. When the content of ammonia is in the above range, the etching rate with respect to the ruthenium is not excessively low and the production of ruthenium tetroxide is reduced.

<Other Components>

The etching solution of the present embodiment may include other components in addition to the components described above in a range in which the effects of the present invention are not impaired. Examples of other components include water, a water-soluble organic solvent, a pH adjuster, a surfactant, an oxidizing agent, and the like.

In addition, the etching solution of the present embodiment may include, for example, a slurry (metal oxide particles) used in a chemical mechanical polishing (CMP) process, or may not include such a slurry (metal oxide particles).

However, for example, in a case of being used where the etching solution of the present embodiment is applied through a mask to a thin film of ruthenium disposed on a substrate to form ruthenium wiring, such a slurry (metal oxide particles) is preferably not included from the viewpoint of the process stability.

The etching solution of the present embodiment preferably does not include an abrasive. The abrasive is, for example, metal oxide particles such as alumina, silica, titania, ceria, and zirconia. The etching solution of the present embodiment preferably does not include these metal oxide particles.

Water

The etching solution of the present embodiment preferably includes water as a solvent for the components described above. The water may include trace components inevitably mixed therein. The water used in the etching solution of the present embodiment is preferably water subjected to a purification process such as distilled water, ion-exchanged water, or ultrapure water, and it is more preferable to use ultrapure water generally used in semiconductor manufacturing.

The content of the water in the etching solution of the present embodiment is not particularly limited, but is preferably 80% by mass or more, more preferably 90% by mass or more, and even more preferably 94% by mass or more. In addition, the upper limit is not particularly limited, but is preferably less than 99.95% by mass, more preferably 99.9% by mass or less, and even more preferably 99.5% by mass or less. The etching solution of the present embodiment is preferably an aqueous solution in which the orthoperiodic acid described above is dissolved in water and which is adjusted to pH 8 or higher and 10 or lower with ammonia.

Water-Soluble Organic Solvent

The etching solution of the present embodiment may contain a water-soluble organic solvent in a range in which the effects of the present invention are not impaired. Examples of water-soluble organic solvents include alcohols (for example, methanol, ethanol, ethylene glycol, propylene glycol, glycerin, 1,3-propanediol, 1,3-butanediol, 1,4-butanediol, diethylene glycol, dipropylene glycol, furfuryl alcohol, and 2-methyl-2,4-pentanediol, and the like), dimethyl sulfoxide, ethers (for example, ethylene glycol dimethyl ether, diethylene glycol dimethyl ether, triethylene glycol dimethyl ether, tetraethylene glycol dimethyl ether, and propylene glycol dimethyl ether), and the like.

In a case where the etching solution of the present embodiment includes a water-soluble organic solvent, the content of the water-soluble organic solvent is preferably 50% by mass or less with respect to the total of the amount of water and the amount of the water-soluble organic solvent, more preferably 30% by mass or less, and even more preferably 10% by mass or less.

pH Adjuster

The etching solution of the present embodiment may include a pH adjuster in a range which does not depart from the object of the present invention. Here, the "pH adjuster" in the present specification refers to a component other than the ammonia described above and which is capable of adjusting the pH of the liquid.

In addition, the amount added is set as appropriate and may be selected after setting the pH to be described below.

As the pH adjuster, it is possible to use an acidic compound or an alkaline compound. Preferable examples of acidic compounds include inorganic acids such as hydrochloric acid, sulfuric acid, and nitric acid, and salts thereof, or organic acids such as acetic acid, lactic acid, oxalic acid, tartaric acid, and citric acid, and salts thereof.

In addition, as the alkaline compound, it is possible to use an organic alkaline compound and an inorganic alkaline compound and suitable examples of the organic alkaline compound include quaternary ammonium salts including organic quaternary ammonium hydroxides, alkylamines such as trimethylamine and triethylamine and salts of derivatives thereof.

Specific examples of the organic quaternary ammonium hydroxide include tetramethylammonium hydroxide (TMAH), bis(2-hydroxyethyl) dimethylammonium hydroxide, tetraethylammonium hydroxide (TEAH), tetrapropylammonium hydroxide, tetrabutylammonium hydroxide, methyltriethylammonium hydroxide, trimethyl (hydroxyethyl) ammonium hydroxide, triethyl (hydroxyethyl) ammonium hydroxide, and the like.

In addition, examples of inorganic alkaline compounds include inorganic compounds including alkali metals or alkaline earth metals and salts thereof. Examples thereof include lithium hydroxide, sodium hydroxide, potassium hydroxide, rubidium hydroxide, cesium hydroxide, and the like.

Surfactant

The etching solution of the present embodiment may include a surfactant for the purpose of adjusting the wettability of the etching solution with respect to the object to be processed, or the like. As the surfactant, it is possible to use a nonionic surfactant, an anionic surfactant, a cationic surfactant, or an amphoteric surfactant, and these may be used in combination.

Examples of nonionic surfactants include polyalkylene oxide alkylphenyl ether surfactants, polyalkylene oxide alkyl ether surfactants, block polymer surfactants formed of polyethylene oxide and polypropylene oxide, polyoxyalkylene distyrenated phenyl ether surfactants, polyalkylene tribenzylphenyl ether surfactants, acetylene polyalkylene oxide surfactants, and the like.

Examples of anionic surfactants include alkyl sulfonic acid, alkyl benzene sulfonic acid, alkyl naphthalene sulfonic acid, alkyl diphenyl ether sulfonic acid, fatty acid amide sulfonic acid, polyoxyethylene alkyl ether carboxylic acid, polyoxyethylene alkyl ether acetic acid, polyoxyethylene alkyl ether propionic acid, alkyl phosphonic acid, fatty acid salts, and the like. Examples of "salts" include ammonium salt, sodium salt, potassium salt, tetramethylammonium salt, and the like.

Examples of cationic surfactants include a quaternary ammonium salt surfactant, an alkyl pyridium surfactant, and the like.

Examples of amphoteric surfactants include betaine surfactants, amino acid surfactants, imidazoline surfactants, amine oxide surfactants, and the like.

These surfactants are generally commercially available. One kind of surfactant may be used alone or two or more kinds may be used in combination.

Oxidizing Agent

The etching solution of the present embodiment may include another oxidizing agent in addition to the orthoperiodic acid described above. Examples of oxidizing agents include transition metal oxide, peroxide, cerium ammonium nitrate, nitrate, nitrite, iodic acid, iodate, periodate, perchlorate, persulfuric acid, persulfate, peracetic acid, peracetic acid salt, permanganic acid compounds, dichromic acid compounds, and the like.

<pH>

The etching solution of the present embodiment has a pH of 8 or higher and 10 or lower. By adjusting the pH to 8 or higher and 10 or lower using ammonia as a pH adjuster, it is possible to maintain a practical etching rate with respect to ruthenium and reduce the risk of generating ruthenium tetroxide. From the viewpoint of the etching rate, the etching solution of the present embodiment preferably has a pH of 9.5 or lower, more preferably a pH of 9.0 or lower, and even more preferably a pH of 8.5 or lower. The etching solution of the present embodiment preferably has a pH of more than 8 from the viewpoint of further reducing the risk of generating ruthenium tetroxide. As the pH range of the etching solution of the present embodiment, the pH is preferably 8 or higher and 9.5 or lower, more preferably 8 or higher and 9.0 or lower, and even more preferably 8 or higher and 8.5 or lower. In addition, as the pH range of the etching solution of the present embodiment, the pH is preferably more than 8 and 9.5 or lower, more preferably more than 8 and 9.0 or lower, and even more preferably more than 8 and 8.5 or lower.

The pH value described above is a value measured with a pH meter under conditions of normal temperature (23° C.) and normal pressure (1 atm).

<Number of Particles Larger than 100 nm>

In the etching solution of the present embodiment, the number of particles larger than 100 nm is preferably 20 particles/mL or less. The number of particles larger than 100 nm is preferably 15 particles/mL or less, more preferably 10 particles/mL or less, and even more preferably 5 particles/mL or less. By setting the number of particles larger than 100 nm to the above upper limit or less, for example, when the etching solution is applied to the substrate including an area formed of an insulating film and an area formed of ruthenium in a surface layer as described later, the risk of particles entering on ruthenium forming a recess can be reduced. It is possible to measure the number of particles larger than 100 nm in 1 mL of the etching solution by an optical scattering type in-liquid particle sensor. Examples of the optical scattering type in-liquid particle sensor include KS-19F manufactured by Rion Co., Ltd., and the like.

<Object to be Processed>

The etching solution of the present embodiment is used for ruthenium etching and an object to be processed including ruthenium is the object of the etching process. The object to be processed is not particularly limited as long as the object includes ruthenium and examples thereof include a substrate having a ruthenium-containing layer (ruthenium-containing film) or the like. The substrate is not particularly limited and examples thereof include various substrates such as a semiconductor wafer, a glass substrate for a photomask, a glass substrate for a liquid crystal display, a glass substrate for a plasma display, a substrate for a Field-Emission Display (FED), a substrate for an optical disc, a substrate for a magnetic disk, and a substrate for a magneto-optical disc. As the substrate, a substrate used for semiconductor device production is preferable. In addition to the ruthenium-containing layer and the base material of the substrate, the substrate may have various layers and structures as appropriate, such as, for example, metal wiring, a gate structure, a source structure, a drain structure, an insulating layer, a ferromagnetic layer, a non-magnetic layer, and the like. In addition, the uppermost layer on the device surface of the substrate does not need to be the ruthenium-containing layer and, for example, the intermediate layer of the multilayer structure may be the ruthenium-containing layer.

The size, thickness, shape, layer structure, and the like of the substrate are not particularly limited and appropriate selection according to the purpose is possible.

The ruthenium-containing layer is preferably a layer containing a ruthenium metal, and more preferably a ruthenium metal film. The thickness of the ruthenium-containing layer on the substrate is not particularly limited and appropriate selection according to the purpose is possible. Examples of the thickness of the ruthenium-containing layer include a range of 1 to 500 nm and 1 to 300 nm.

<Uses>

The etching solution of the present embodiment may be used for performing fine processing of the ruthenium-containing layer in the substrate, may be used for removing ruthenium-containing deposits attached to the substrate, and may be used to remove impurities such as particles from the object to be processed having the ruthenium-containing layer on the surface.

More specifically, examples of uses of the etching solution of the present embodiment include a process for selectively etching an area formed of ruthenium in a substrate including an area formed of an insulating film and the area formed of ruthenium in a surface layer (a recess etching process for a ruthenium-containing wiring arranged on a substrate); removal of a ruthenium-containing film on an outer edge portion of a substrate on which a ruthenium-containing film is arranged; removal of ruthenium-containing substances attached to a back surface of a substrate on which a ruthenium-containing film is arranged; removal of ruthenium-containing substances on a substrate after dry etching; removal of ruthenium-containing substances on a substrate after a CMP process, and the like. However, in one aspect, the etching solution of the present embodiment is not used for a CMP process.

<<Recess Etching Process>>

As a use of the etching solution of the present embodiment, a process for selectively etching an area formed of ruthenium in a substrate including an area formed of an insulating film and the area formed of ruthenium in a surface layer is preferable. Specific examples of such process include a recess etching process for a ruthenium-containing wiring arranged on a substrate is preferable. The term "recess etching process" means a process of forming a concave portion (recess) in a ruthenium-containing wiring arrangement portion on the substrate by an etching process on the ruthenium-containing wiring arranged on the substrate (manufacture of ruthenium-containing wiring having a recess). In particular, in a case where the number of particles larger than 100 nm included in the etching solution of the present embodiment is 20 particles/mL or less, the etching solution of the present embodiment is suitable for a recess etching process for a ruthenium-containing wiring arranged on a substrate. In the recess etching process for a ruthenium-containing wiring, it is concerned that impurity particles included in the etching solution may enter a recess, and it is hard to remove such impurity particles. Performing the recess etching process using an etching solution in which the number of particles larger than 100 nm is 20 particles/mL or less makes it possible to reduce such risk.

FIG. 1 is a schematic view showing an example of a substrate having a ruthenium-containing wiring (also referred to below as a "wiring substrate"), which is an object to be processed by a recess-etching process. The wiring substrate 1 has a substrate 3, an underlayer 4 on the substrate, an insulating film 5 having a trench 8 arranged on the underlayer 4, a barrier metal layer 6 arranged along the inner wall of the trench 8, and a ruthenium-containing wiring 7 filled inside the trench. In the wiring substrate 1, the insulating film 5 forms an area formed of an insulating film. The ruthenium-containing wiring 7 forms an area formed of ruthenium.

For the substrate 3, the thickness, shape, layer structure, and the like are not particularly limited and can be appropriately selected. Examples of the substrate 3 include various substrates such as a semiconductor wafer, a glass substrate for a photomask, a glass substrate for a liquid crystal display, a glass substrate for a plasma display, a substrate for a Field-Emission Display (FED), an optical disc substrate, a magnetic disk substrate, and a magneto-optical disc substrate. Examples of the material forming the semiconductor substrate include Group III-V compounds such as silicon, silicon germanium, and GaAs, any combinations thereof, and the like.

In addition to the above configuration, the substrate 3 can have any structure as appropriate. For example, the substrate 3 may have a metal wiring, a gate electrode, a source electrode, a drain electrode, an insulating layer, a ferromagnetic layer, a non-magnetic layer, and the like. The substrate 3 may have an exposed integrated circuit structure, for example, an interconnection mechanism such as metal wiring and dielectric material. Examples of metals and alloys used for the interconnection mechanism include aluminum, copper-aluminum alloy, copper, titanium, tantalum, cobalt, silicon, titanium nitride, tantalum nitride, and tungsten. The substrate 3 may have layers of silicon oxide, silicon nitride, silicon carbide, and/or carbon-doped silicon oxide.

The ruthenium-containing wiring 7 preferably includes ruthenium alone, a ruthenium alloy, a ruthenium oxide, a ruthenium nitride, or a ruthenium oxynitride. The content of ruthenium in the ruthenium-containing wiring 7 is preferably 50% by mass or more with respect to the total mass (100% by mass) of the ruthenium-containing wiring, more preferably 60% by mass or more, even more preferably 80% by mass or more, and may be 100% by mass. The content of ruthenium is, for example, 50 to 90 atomic %. The ruthenium-containing wiring 7 can be formed by a known method, for example, CVD, ALD, and the like can be used.

The material forming the underlayer 4 is not particularly limited, and examples thereof include silicon nitride (SiN), silicon carbon nitride (SiCN), silicon carbide (SiC), aluminum oxide ($AlO_x$), aluminum nitride (AlN), and oxide-doped carbon (ODC: oxide-doped carbon), and the like.

It is possible for the insulating film 5 to be, for example, an oxide film, or a Low-k layer, for example, formed of SiOCH, doped silicon dioxide (fluorine, carbon and other dopants), spin-on polymers (including organic and silicon-based polymers), a porous oxide, or the like.

The material forming the barrier metal layer 6 is not particularly limited, and examples thereof include titanium nitride (TiN), tantalum nitride (TaN), and the like. In the example of FIG. 1, the wiring substrate 1 having the barrier metal layer 6 is shown, but the wiring substrate may not have the barrier metal layer. In addition, a liner layer (not shown) may be arranged between the barrier metal layer 6 and the ruthenium-containing wiring 7. The material forming the liner layer is not particularly limited, and examples thereof include Ru-containing substances and Cu-containing substances.

The manufacturing method of the wiring substrate 1 is not particularly limited and examples thereof include a method including a step of forming an underlayer on a substrate, a step of forming an insulating film, a step of forming a trench in the insulating film, a step of forming a barrier metal layer on the insulating film, a step of forming a ruthenium-containing film so as to fill the trench, and a step of carrying out a flattening process on the ruthenium-containing film. In addition, a step of forming a liner layer on the barrier metal layer may be included between the step of forming the barrier metal layer on the insulating film and the step of forming a ruthenium-containing film so as to fill the trench.

Figure 2:
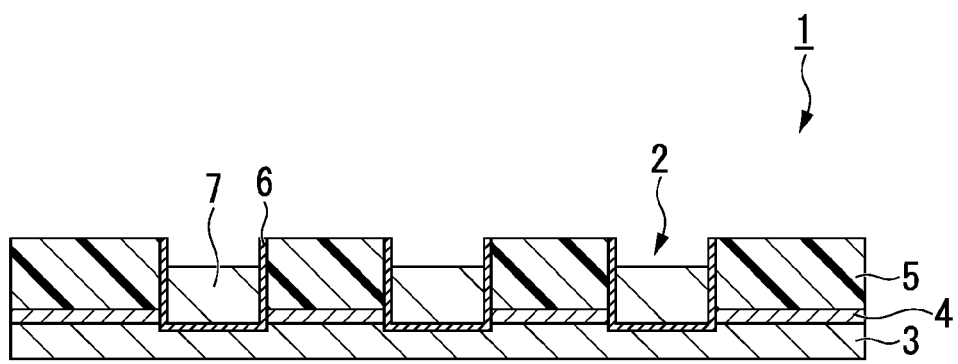
FIG. 2 is a schematic view showing an example of a wiring substrate after a recess etching process.

By performing a recess etching process with respect to the ruthenium-containing wiring 7 in the wiring substrate 1 using the etching solution of the present embodiment, it is possible to remove a part of the ruthenium-containing wiring to form the recess 2 (FIG. 2).

Examples of a specific method of a recess etching process include a method of bringing the etching solution of the present embodiment into contact with the wiring substrate 1. The contacting method is not particularly limited, and examples thereof include a method of immersing the wiring substrate 1 in the etching solution of the present embodiment placed in a tank (immersion method); a method of discharging the etching solution of the present embodiment on the wiring substrate 1 (single wafer spin method); a method of filling the etching solution of the present embodiment on the wiring substrate 1 (liquid filling method); a method of making the etching solution of the present embodiment flow on the wiring substrate 1; or a combination of the above.

It is possible to appropriately adjust the processing time of the recess etching process according to the etching method, the temperature of the etching solution, and the like. The processing time (contact time between the etching solution and the wiring substrate) is not particularly limited, and examples thereof include 0.01 to 30 minutes, 0.1 to 20 minutes, 0.1 to 10 minutes, 0.15 to 5 minutes, and the like.

The temperature of the etching solution during the recess etching process is not particularly limited, and examples thereof include 15 to 75° C., 15 to 65° C., 15 to 65° C., 15 to 50° C., and the like.

After the recess etching process, the wiring substrate obtained by the recess etching process may be processed with a predetermined chemical solution, as necessary. In particular, in a case where the barrier metal layer is arranged on the wiring substrate as in the wiring substrate 1, the components forming the ruthenium-containing wiring and the components forming the barrier metal layer may have different solubilities with respect to the etching solution depending on the type. In such a case, it is preferable to adjust the degree of dissolution between the ruthenium-containing wiring and the barrier metal layer using a chemical solution having a higher solubility with respect to the barrier metal layer. From this point of view, the chemical solution is preferably a chemical solution having a poor ability to dissolve the ruthenium-containing wiring and an excellent ability to dissolve substances forming the barrier metal layer.

Examples of the chemical solution include solutions selected from the group consisting of a mixed solution of aqueous ammonia and a hydrogen peroxide solution (APM), and a mixed solution of hydrochloric acid and a hydrogen peroxide solution (HPM). The composition of APM is preferably, for example, in a range (volume ratio) of "aqueous ammonia:hydrogen peroxide solution:water=1:1:500" to "aqueous ammonia:hydrogen peroxide solution:water=1:1:3". The composition of HPM is preferably, for example, in a range (volume ratio) of "hydrochloric acid:hydrogen peroxide solution:water=1:1:3" to "hydrochloric acid:hydrogen peroxide solution:water=1:1:400".

The description of these preferable composition ratios is intended to be a composition ratio in cases where the aqueous ammonia has a concentration of 28% by mass, the hydrochloric acid has a concentration of 37% by mass, and the hydrogen peroxide solution has a concentration of 31% by mass.

APM is preferable from the viewpoint of the ability to dissolve the barrier metal layer or ability to remove particles.

Examples of the method for processing the wiring substrate after the recess etching using the chemical solution include a method of bringing the chemical solution into contact with the wiring substrate after the recess etching process. Examples of the contact method include the same method as the contact method exemplified in the recess etching process. Examples of the contact time between the chemical solution and the wiring substrate after the recess etching process include 0.1 to 10 minutes, 0.15 to 5 minutes, and the like.

In this processing method, the recess etching process and the process with the chemical solution may be carried out alternately. In a case of being alternately carried out, it is preferable to carry out the cycle of the recess etching process and the process with the chemical solution 1 to 10 times each.

<<Removal of Ruthenium-Containing Film on Outer Edge Portion of Substrate>>

The etching solution of the present embodiment may be used to remove the ruthenium-containing film on the outer edge portion of the substrate on which the ruthenium-containing film is arranged. The etching solution of the present embodiment may be used for removing a ruthenium-containing film positioned at an outer edge portion in a laminate having, for example, a substrate and a ruthenium-containing film arranged on a main surface on one side of the substrate.

The ruthenium-containing film preferably includes ruthenium alone, a ruthenium alloy, a ruthenium oxide, a ruthenium nitride, or a ruthenium oxynitride.

The specific method is not particularly limited, and examples thereof include a method of supplying the chemical solution from a nozzle such that the etching solution of the present embodiment comes into contact only with the ruthenium-containing film on the outer edge portion of the substrate. Examples of the contact method include the same methods as described above. The preferable ranges of the contact time and the temperature of the etching solution are the same as those described above.

<<Removal of Ruthenium-Containing Substances Attached to Back Surface of Substrate>>

The etching solution of the present embodiment may be used to remove the ruthenium-containing substance attached to the back surface of a substrate on which the ruthenium-containing film is arranged. When forming a laminate in which a substrate and a ruthenium-containing film on a main surface on one side of the substrate are arranged, the ruthenium-containing film is formed by sputtering, CVD, or the like. At that time, the ruthenium-containing substance may be attached on the surface (on the back surface) on the opposite side to the ruthenium-containing film side of the substrate. In order to remove the ruthenium-containing substance attached to the back surface of such a laminate, the etching solution of the present embodiment may be used.

The specific method is not particularly limited, and examples thereof include a method of discharging a chemical solution such that the etching solution of the present embodiment comes into contact only with the back surface of the substrate. Examples of the contact method include the same methods as described above. The preferable ranges of the contact time and the temperature of the etching solution are the same as those described above.

According to the etching solution of the present embodiment described above, since orthoperiodic acid is included as an oxidizing agent and the pH is adjusted to 8 or higher and 10 or lower with ammonia, a practical etching rate with respect to ruthenium is maintained and it is possible to reduce the risk of generating ruthenium tetroxide. Therefore, using the etching solution of the present embodiment makes it possible to safely and suitably perform fine processing of the ruthenium-containing layer, cleaning of the ruthenium substrate, and the like.

In addition, in a case where the number of particles larger than 100 nm in the etching solution of the present embodiment is 20 particles/mL or less, suitable use is possible in a recess etching process for a ruthenium-containing wiring.

(Method for Manufacturing Etching Solution)

The method for manufacturing an etching solution according to the second aspect of the present invention includes a step of preparing a mixed solution by mixing a solution including orthoperiodic acid with aqueous ammonia, and adjusting the pH of the mixed solution to 8 or higher and 10 or lower (also referred to below as "step (i)"), and a step of filtering the mixed solution with a filter (also referred to below as "step (ii)"), in this order. The etching solution according to the first aspect is manufactured by the manufacturing method of the present embodiment.

<Step (i)>

Step (i) is a step of preparing a mixed solution by mixing a solution including orthoperiodic acid with aqueous ammonia, and adjusting the pH of the mixed solution to 8 or higher and 10 or lower.

It is possible to produce a solution including orthoperiodic acid (also referred to below as "orthoperiodic acid solution") by dissolving an appropriate amount of orthoperiodic acid in water. It is possible to set the concentration of orthoperiodic acid in the orthoperiodic acid solution to be a higher concentration than the concentration of orthoperiodic acid in the final etching solution.

The orthoperiodic acid solution may appropriately include any component in addition to the orthoperiodic acid. Examples of the component include the components exemplified in the section "<Other Components>" in the above "(Etching Solution)".

Next, aqueous ammonia is added to the orthoperiodic acid solution and mixed to prepare a mixed solution. As the aqueous ammonia, it is possible to use commercially available products, and, for example, it is possible to use 25% to 30% by mass aqueous ammonia, and the like.

The adding of the aqueous ammonia to the orthoperiodic acid solution is performed while measuring the pH of the mixed solution using a pH meter. The temperature of the orthoperiodic acid solution and the mixed solution at this time is preferably maintained at 23° C. When the pH of the mixed solution reaches the desired pH in the range of pH 8 or higher and 10 or lower, the addition of aqueous ammonia is finished.

Next, water is added to the mixed solution such that the concentration of orthoperiodic acid is the desired concentration. The concentration of orthoperiodic acid is preferably adjusted to be in the suitable concentration range described in the section "<Orthoperiodic acid>" in the "(Etching Solution)" described above.

Through this step, it is possible to obtain a mixed solution of orthoperiodic acid solution and aqueous ammonia, which has a pH of 8 or higher and 10 or lower.

<Step (ii)>

The step (ii) is a step of filtering the mixed solution with a filter.

The filter used in this step is not particularly limited, and it is possible to use a filter generally used for manufacturing a chemical solution used in a semiconductor process without particular limitation. Examples of the filter material include fluororesins such as polytetrafluoroethylene (PTFE), polyamide resins such as nylon, and polyolefin resins such as polyethylene and polypropylene (PP) (including high density and ultrahigh molecular weight), and the like. Among the above, polyethylene material, polypropylene material, polytetrafluoroethylene material, or nylon material is preferable, polyethylene material or polytetrafluoroethylene material is more preferable, and polytetrafluoroethylene material is particularly preferable.

The pore size of the filter is preferably 100 nm or less, more preferably 50 nm or less, even more preferably 20 nm or less, and particularly preferably 15 nm or less. It is also possible to remove fine particles by using a filter having a pore size which is the upper limit or less. The lower limit of the pore size of the filter is not particularly limited, but can be, for example, 0.1 nm or more or 0.5 nm or more from the viewpoint of filtration efficiency.

The filter may use a combination of two or more types of filters. In a case where two or more types of filters are used, filters having the same pore size made of different materials may be used, filters having different pore sizes made of the same material may be used, or filters having different pore sizes made from different materials may be used. For example, the mixed solution may be filtered using the first filter and then filtered through a second filter having a smaller pore size than the first filter.

The number of times the mixed solution is filtered is not particularly limited and can be set to any number of times. It is possible for the number of times of filtration to be, for example, 3 times or more, preferably 5 times or more, more preferably 10 times or more, even more preferably 15 times or more, and particularly preferably 20 times or more, 25 times or more, or 30 times or more. By setting the number of times of filtration to the lower limit or more, it is possible to further reduce the fine particles in the mixed solution. The upper limit of the number of times of filtration of the mixed solution is not particularly limited, but, for example, can be set to 50 times or less from the viewpoint of manufacturing efficiency.

In a case of performing filtering by combining two or more types of filters, it is possible to count the number of times of filtration as one time at the time point when the mixed solution passes through the last filter in the two or more types of filters in the combination (also referred to below as "filter set").

In a case where the number of times of filtration is 2 or more, it is preferable to filter the mixed solution by circulation filtration.

Through this step, it is possible to reduce fine particles in the mixed solution and to obtain a high-quality etching solution.

According to the manufacturing method of the present embodiment, it is possible to obtain a high-quality etching solution in which impurity particles (for example, particles larger than 100 nm) are reduced. In the etching solution obtained by the manufacturing method of the present embodiment, for example, the number of particles larger than 100 nm is 20 particles/mL or less. Therefore, it is possible to suitably use the etching solution obtained by the manufacturing method of the present embodiment for a recess etching process for a ruthenium-containing wiring arranged on a substrate.

(Method for Processing Object to be Processed)

The method for processing an object to be processed according to the third aspect of the present invention includes a step of carrying out an etching process on the object to be processed including ruthenium, using the etching solution according to the first aspect described above.

Examples of the object to be processed including ruthenium include the same examples as those described in "<Object to be Processed>" in the "(Etching Solution)" described above and preferable examples include a substrate having a ruthenium-containing layer. The method for forming the ruthenium-containing layer on the substrate is not particularly limited and it is possible to use known methods. Examples of such methods include a sputtering method, a chemical vapor deposition (CVD) method, a molecular beam epitaxy (MBE) method, an atomic layer deposition (ALD) method, and the like. The raw material of the ruthenium-containing layer used when forming the ruthenium-containing layer on the substrate is not particularly limited, and appropriate selection thereof is possible according to the film-forming method.

<Step for Carrying Out Etching Process on Object to be Processed>

This step is a step of carrying out an etching process on the object to be processed including ruthenium, using the etching solution according to the first aspect, and includes an operation of bringing the etching solution into contact with the object to be processed. The etching process method is not particularly limited and it is possible to use a known etching method. Examples of such methods include a spray method, an immersion method, a liquid filling method, or the like, without being limited thereto.

In the spray method, for example, the object to be processed is transported or rotated in a predetermined direction, the etching solution according to the first aspect is sprayed into a space such that the etching solution is brought into contact with the object to be processed. As necessary, the etching solution may be sprayed while rotating the substrate using a spin coater.

In the immersion method, the object to be processed is immersed in the etching solution according to the first aspect and the etching solution is brought into contact with the object to be processed.

In the liquid filling method, the etching solution according to the first aspect is filled in the object to be processed and the object to be processed and the etching solution are brought into contact with each other.

It is possible to appropriately select these etching process methods depending on the structure, materials, and the like of the object to be processed. In a case of the spray method or the liquid filling method, it is sufficient if the supply amount of the etching solution to the object to be processed is an amount by which the surface to be processed in the object to be processed is sufficiently wetted by the etching solution.

The purpose of the etching process is not particularly limited and may be fine processing for a surface to be processed of the object to be processed including ruthenium (for example, a ruthenium-containing layer on a substrate), may be removal of a ruthenium-containing deposit attached to the object to be processed (for example, a substrate having a ruthenium-containing layer), or may be cleaning of a surface to be processed of the object to be processed including ruthenium (for example, a ruthenium-containing layer on the substrate).

In a case where the purpose of the etching process is fine processing of the surface to be processed of the object to be processed including ruthenium, normally, the portion not to be etched is covered with an etching mask and the object to be processed and the etching solution are brought into contact with each other. In a case where the purpose of the etching process is the removal of ruthenium-containing deposits attached to the object to be processed, the ruthenium-containing deposits are dissolved by bringing the etching solution according to the first aspect into contact with the object to be processed and it is possible to remove the ruthenium deposits from the object to be processed.

In a case where the purpose of the etching process is to clean the surface to be processed of a processing object including ruthenium, the surface to be processed is rapidly dissolved by bringing the etching solution according to the first aspect into contact with the object to be processed and impurities such as particles attached to the surface of the object to be processed are removed from the surface of the object to be processed in a short time.

Examples of the purposes of etching process include the same purposes as described above in <<Recess Etching Process>>.

The temperature at which the etching process is performed is not particularly limited as long as the ruthenium is dissolved with the etching solution. Examples of the temperature for the etching process include 20° C. to 60° C. In a case of any of the spray method, the immersion method, and the liquid filling method, the etching rate is increased by increasing the temperature of the etching solution, but it is possible to appropriately select the processing temperature in consideration of suppressing composition changes in the etching solution to be small, or workability, safety, cost, and the like.

The time for performing the etching process may be appropriately selected according to the purpose of the etching process, the amount of ruthenium to be removed by the etching (for example, the thickness of the ruthenium-containing layer, the amount of ruthenium deposits, and the like), and the etching process conditions.

Specific examples of the etching process include the processes exemplified in the section "<Uses>" in the above "(Etching Solution)". In one aspect, the etching process of the present embodiment does not include a CMP process. As the etching process, a process for selectively etching an area formed of ruthenium in a substrate including an area formed of an insulating film and the area formed of ruthenium in a surface layer is preferable. A recess etching process for a ruthenium-containing wiring is particularly preferable.

<Optional Step>

The processing method of the present embodiment may include an optional step in addition to the steps described above. Examples of the optional step include a step of performing a rinsing process on the object to be processed.

After carrying out an etching process on the object to be processed in the above step, an iodine compound derived from the etching solution according to the first aspect may be attached as residual iodine on the surface of the object to be processed. There is a concern that such residual iodine may adversely affect subsequent processes. Therefore, it is preferable to perform a rinsing process in order to remove residual iodine from the surface of the object to be processed. In addition, the rinsing process also makes it possible to remove the residue or the like of ruthenium-containing substances occurring on the surface of the object to be processed by the etching process.

It is possible to perform the rinsing process by bringing the rinsing solution into contact with the object to be processed. The contact method is not particularly limited and examples thereof include a method of immersing the object to be processed in a rinsing solution in a tank, a method of spraying a rinsing solution on the surface of the object to be processed, a method of causing a rinsing solution to flow on the surface of the object to be processed, a method combining any of the above, and the like.

Examples of the rinsing solution include hydrofluoric acid, hydrochloric acid, a hydrogen peroxide solution, ammonia, tetramethylammonium hydroxide (TMAH), choline, a mixed solution of hydrofluoric acid and a hydrogen peroxide solution (FPM), a mixed solution of sulfuric acid and a hydrogen peroxide solution (SPM), a mixed solution of aqueous ammonia and a hydrogen peroxide solution (APM), a mixed solution of hydrochloric acid and a hydrogen peroxide solution (HPM), carbon dioxide water, ozone water, hydrogen water, a citric acid aqueous solution, sulfuric acid, aqueous ammonia, isopropyl alcohol, a hypochlorite acid aqueous solution, ultrapure water, nitric acid, an oxalic acid aqueous solution, acetic acid (including an acetic acid aqueous solution), and the like. By rinsing process using the rinsing solution as described above, it is possible to efficiently remove the residue of the ruthenium-containing substance occurring on the surface of the object to be processed by the etching process.

Examples of the acidic rinsing solution include a citric acid aqueous solution (preferably 0.01 to 10% by mass of the citric acid aqueous solution), hydrofluoric acid (preferably 0.001 to 1% by mass of hydrofluoric acid), hydrochloric acid (preferably 0.001 to 1% by mass of hydrochloric acid), a hydrogen peroxide solution (preferably 0.05 to 6% by mass of a hydrogen peroxide solution, more preferably 0.3 to 4.5% by mass of a hydrogen peroxide solution), a mixed solution of hydrofluoric acid and a hydrogen peroxide solution (FPM), a mixed solution of sulfuric acid and a hydrogen peroxide solution (SPM), a mixed solution of hydrochloric acid and a hydrogen peroxide solution (HPM), carbon dioxide water (preferably 10 to 60 ppm by mass of carbon dioxide water), ozone water (preferably 5 to 60 ppm by mass of ozone water), hydrogen water (preferably 0.5 to 20 ppm by mass of hydrogen water), sulfuric acid (preferably 1 to 10% by mass of a sulfuric acid aqueous solution), ammonia water (preferably 0.05 to 6% by mass of ammonia water), TMAH aqueous solution (preferably 0.05 to 5% by mass of TMAH aqueous solution), a choline aqueous solution (preferably 0.05 to 5% by mass of a choline aqueous solution), nitric acid (preferably 0.001 to 1% by mass of nitric acid), an oxalic acid aqueous solution (preferably 0.01 to 10% by mass of oxalic acid aqueous solution), acetic acid (preferably 0.01 to 10% by mass of an acetic acid aqueous solution or an acetic acid stock solution), and the like.

Preferable conditions for FPM, SPM, APM, and HPM are the same as described above.

Here, hydrofluoric acid, nitric acid, and hydrochloric acid are intended as aqueous solutions in which HF, $HNO_3$, and HCl are dissolved in water, respectively. Ozone water, carbon dioxide water, ammonia water, THAM aqueous solution, choline aqueous solution and hydrogen water are intended as aqueous solutions in which $O_3$, $CO_2$, $NH_3$, methylammonium hydroxide $([(CH_3)_4N]^+[OH]^-)$, choline (trimethyl-2-hydroxyethylammonium hydroxide; $[(CH_3)_3N(CH_2)_2OH]^+[OH]^-$), and $H_2$ are dissolved in water, respectively.

These rinsing solutions may be mixed and used in a range in which the purpose of the rinsing process is not impaired. In addition, the rinsing solution may include an organic solvent.

The process time of the rinsing process (contact time between the rinsing solution and the object to be processed) is not particularly limited, but is, for example, 5 seconds to 5 minutes. The temperature of the rinsing solution during the process is not particularly limited, but for example, in general, 16 to 60° C. is preferable, and 18 to 40° C. is more preferable.

According to the method for processing an object to be processed of the present embodiment described above, an etching process for an object to be processed is performed using an etching solution according to the first aspect described above including orthoperiodic acid as an oxidizing agent and prepared to have pH 8 or higher and 10 or lower with ammonia. Since the etching solution has a low risk of generating ruthenium tetroxide and has a practical etching rate for ruthenium, it is possible to safely perform the ruthenium etching process. Therefore, it is possible to suitably use the processing method of the present embodiment for fine processing of a ruthenium-containing layer formed on a substrate, cleaning of a ruthenium substrate, and the like.

(Method for Manufacturing Ruthenium-Containing Wiring)

The method for manufacturing a ruthenium-containing wiring according to a fourth aspect of the present invention includes a step of applying the etching solution to a substrate including an area formed of an insulating film and an area formed of ruthenium in a surface layer, and thereby selectively etching the area formed of ruthenium.

It is possible to perform the manufacturing method of the present embodiment in the same manner as the method described in "<<Recess Etching Process>>" in the above "(Etching Solution)".

(Method for Manufacturing Semiconductor Element)

The method for manufacturing a semiconductor element according to the present embodiment includes a step of carrying out an etching process on the object to be processed including ruthenium, using the etching solution according to the first aspect described above.

It is possible to perform the step of carrying out an etching process on the object to be processed including ruthenium in the same manner as the method illustrated in the "(Method for Processing Object to be Processed)" described above. The object to be processed including ruthenium is preferably a substrate having a ruthenium-containing layer. As the substrate, it is possible to use a substrate usually used for semiconductor element production.

<Other Steps>

The method for manufacturing the semiconductor element of the present embodiment may include other steps in addition to the etching process step described above. The other steps are not particularly limited and examples thereof include known steps performed when manufacturing a semiconductor element. Examples of the steps include a step for forming each structure such as a metal wiring, a gate structure, a source structure, a drain structure, an insulating layer, a ferromagnetic layer, and a non-magnetic layer (layer formation, etching other than the etching process described above, chemical mechanical polishing, modification, and the like), a resist film formation step, an exposure step, a development step, a heating step, a cleaning step, an inspection step, and the like, without being limited thereto. It is possible to appropriately perform these other steps before or after the etching process step as necessary.

According to the method for manufacturing a semiconductor element of the present embodiment described above, an etching process for an object to be processed is performed using an etching solution according to the first aspect described above including orthoperiodic acid as an oxidizing agent and prepared to have pH 8 or higher and 10 or lower with ammonia. Since the etching solution has a low risk of generating ruthenium tetroxide and has a practical etching rate with respect to ruthenium, it is possible to safely perform fine processing of the ruthenium-containing layer formed on the substrate and cleaning of the substrate. Therefore, it is possible to suitably use the manufacturing method of the present embodiment for manufacturing a semiconductor element including ruthenium wiring or the like.

EXAMPLES

A more detailed description will be given below of the present invention with reference to Examples, but the present invention is not limited to these Examples.

<Preparation of Etching Solution (1)>

Examples 1 to 5, Comparative Examples 1 to 3

2 g of orthoperiodic acid was dissolved in water. Ammonia was added to the orthoperiodic acid solution while measuring the pH at 23° C. using a pH meter, and the pH was adjusted to each pH shown in Table 1. Then, water was added such that the total volume of the solution was 100 mL thereby preparing etching solutions of each Example.

TABLE 1

|  | pH |
|---|---|
| Example 1 | 8.0 |
| Example 2 | 8.5 |
| Example 3 | 9.0 |
| Example 4 | 9.5 |
| Example 5 | 10.0 |
| Comparative Example 1 | 3.0 |
| Comparative Example 2 | 6.0 |
| Comparative Example 3 | 10.5 |

<Etching Process for Object to be Processed (1)>

As the object to be processed, a ruthenium substrate in which a ruthenium film (thickness 30 nm) formed by the ALD method on a 12-inch silicon substrate was used. The etching process was performed by placing the etching solution of each Example in a beaker and immersing the ruthenium substrate in the etching solution of each Example at room temperature (23° C.).

[Etching Rate Evaluation]

After performing the etching process by the method shown in "<Etching Process for Object to be Processed>" above, the object to be processed was taken out from the etching solution and the sheet resistance value of the substrate surface was measured. The etching rate of each Example was calculated from the sheet resistance value. The results are shown in Table 2 as "Etching Rate".

[Evaluation of Ruthenium Tetroxide Production]

20 mL of the etching solution of each Example was placed into a bottle and 0.01 g of ruthenium powder was added thereto. Immediately after adding the ruthenium powder, the bottle inlet was sealed with parafilm and left to stand at room temperature for 3 days. Then, the discoloration of the parafilm was visually confirmed and evaluated according to the following evaluation criteria. The results are shown in Table 2 as "discoloration of parafilm". Discoloration of the parafilm indicates that ruthenium tetroxide was produced.

Evaluation Criteria
A: No discoloration of parafilm
B: Parafilm discoloration

TABLE 2

| | Etching rate (nm/min) | Parafilm discoloration |
|---|---|---|
| Example 1 | 9.1 | A |
| Example 2 | 7.2 | A |
| Example 3 | 4.4 | A |
| Example 4 | 1.2 | A |
| Example 5 | 0.5 | A |
| Comparative Example 1 | 10.6 | B |
| Comparative Example 2 | 56.9 | B |
| Comparative Example 3 | <0.5 | A |

As is clear from Table 2, in Examples 1 to 5, the parafilm did not discolor and the production of ruthenium tetroxide was not observed. In addition, the etching rate was maintained in a practical range.

On the other hand, in Comparative Examples 1 and 2, although the etching rate was high, the parafilm was discolored and the production of ruthenium tetroxide was confirmed. In Comparative Example 3, the production of ruthenium tetroxide was not observed, but the etching rate was low, which is not practical.

From the above, it is possible to confirm that the etching solution of the Examples to which the present invention was applied can perform a ruthenium etching process while reducing the risk of generating ruthenium tetroxide.

Adjustment of Etching Solution (2)

Examples 6 to 10, Comparative Examples 4 to 6

2 g of orthoperiodic acid was dissolved in water. Ammonia was added to the orthoperiodic acid solution while measuring the pH at 23° C. using a pH meter, and the pH was adjusted to each pH shown in Table 3. Then, water was added such that the total volume of the solution was 2000 mL and the etching solutions of each Example were prepared by being passed through a filter made of polytetrafluoroethylene (PTFE) having a pore size of 15 nm 30 times. For the etching solutions of each Example, the number of particles larger than 100 nm per 1 mL of the etching solution was measured by an optical scattering type in-liquid particle sensor (KS-19F, manufactured by Rion Co., Ltd.). The results are also shown in Table 3 as "number of particles (particles/mL)".

The number of particles in the etching solution of Example 6 was measured without passing through the filter, and the number of particles larger than 100 nm was over 10,000 particles/mL.

TABLE 3

| | pH | Number of Particles [Particles/mL] |
|---|---|---|
| Example 6 | 8.0 | 3 |
| Example 7 | 8.5 | 3 |
| Example 8 | 9.0 | 2 |
| Example 9 | 9.5 | 2 |
| Example 10 | 10.0 | 3 |
| Comparative Example 4 | 3.0 | 4 |
| Comparative Example 5 | 6.0 | 3 |
| Comparative Example 6 | 10.5 | 3 |

<Etching Process of Object to be Processed (2)>

The etching process of the object to be processed was performed in the same manner as in <Etching Process of Object to be Processed (1)>, except that the etching solutions of Examples 6 to 10 and Comparative Examples 4 to 6 were used as the etching solution.

[Evaluation of Etching Rate/Evaluation of Ruthenium Tetroxide Production]

The etching rate and ruthenium tetroxide production were evaluated by the same method as described above. As a result, in Examples 6 to 10 and Comparative Examples 4 to 6, almost the same results were obtained as in Examples 1 to 5 and Comparative Examples 1 to 3, respectively. That is, in Examples 6 to 10, the etching rate was 1 to 10 nm/min, which was maintained in a practical range. In addition, no discoloration of the parafilm was observed and no ruthenium tetroxide production was confirmed. On the other hand, in Comparative Examples 4 and 5, the etching rate was higher than that of Examples, but the parafilm was discolored and the production of ruthenium tetroxide was confirmed. In addition, in Comparative Example 6, the production of ruthenium tetroxide was not observed, but the etching rate was low, which is not practical.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1 WIRING SUBSTRATE
2 RECESS
3 SUBSTRATE
4 UNDERLAYER
5 INSULATING FILM
6 BARRIER METAL LAYER
7 RUTHENIUM-CONTAINING WIRING

What is claimed is:

1. A ruthenium-etching solution for carrying out an etching process on ruthenium, the ruthenium-etching solution comprising:
   orthoperiodic acid; and
   ammonia as the sole pH adjuster,
   wherein a pH is more than 8 and 9.5 or lower,
   the content of orthoperiodic acid is 0.5 to 3% by mass, and
   a number of particles larger than 100 nm contained in the etching solution is 20 particles/ml or less, and
   the ruthenium etching solution comprises no slurry and no abrasive,
   wherein the ruthenium-etching solution is manufactured by a method consisting of:
   dissolving orthoperiodic acid in water to obtain an orthoperiodic acid solution,
   mixing the orthoperiodic acid solution with aqueous ammonia to adjust the pH of the mixed solution to more than 8 and 9.5 or lower, and
   filtering the mixed solution with a filter.

2. The ruthenium-etching solution according to claim 1, wherein the etching process is not a chemical mechanical polishing (CMP) process.

3. The ruthenium-etching solution according to claim 1, wherein the etching process is a process for applying a substrate including an area formed of an insulate film and an area formed of ruthenium in a surface layer, thereby selectively etching the area formed of ruthenium.

4. A method for manufacturing the ruthenium-etching solution according to claim 1, the method comprising, in the following order:
   preparing a mixed solution by mixing a solution including orthoperiodic acid with aqueous ammonia, and adjusting a pH of the mixed solution to more than 8 and 9.5 or lower; and
   filtering the mixed solution with a filter.

5. A method for processing an object to be processed, the method comprising carrying out an etching process on an object to be processed including ruthenium, using the ruthenium-etching solution according to claim 1.

6. A method for manufacturing a ruthenium-containing wiring, the method comprising applying the ruthenium-etching solution according to claim 1 to a substrate including an area formed of an insulating film and an area formed of ruthenium in a surface layer, thereby selectively etching the area formed of ruthenium.

* * * * *